United States Patent
Lee et al.

(10) Patent No.: US 12,260,035 B2
(45) Date of Patent: Mar. 25, 2025

(54) TOUCH DISPLAY PANEL

(71) Applicant: LG Display Co., Ltd., Seoul (KR)

(72) Inventors: Young-Wook Lee, Goyang-si (KR); Jung-Ho Bang, Paju-si (KR); Jeong-Gi Yun, Gimpo-si (KR); Seon-Hui Hwang, Paju-si (KR); Eun-Young Park, Pohang-si (KR); Jong-Han Park, Seoul (KR); Seung-Hye Cho, Gimpo-si (KR)

(73) Assignee: LG Display Co., Ltd. (KR)

( * ) Notice: Subject to any disclaimer, the term of this patent is extended or adjusted under 35 U.S.C. 154(b) by 46 days.

(21) Appl. No.: 17/134,389

(22) Filed: Dec. 26, 2020

(65) Prior Publication Data

US 2021/0200365 A1 Jul. 1, 2021

(30) Foreign Application Priority Data

Dec. 27, 2019 (KR) .................. 10-2019-0176063

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0445* (2019.05); *H10K 50/841* (2023.02);
(Continued)

(58) Field of Classification Search
CPC ................. G06F 3/0412; G06F 3/0445; G06F 2203/04112; G06F 3/0443; G06F 3/0446;
(Continued)

(56) References Cited

U.S. PATENT DOCUMENTS

2017/0185191 A1 6/2017 Kim et al.
2019/0064960 A1* 2/2019 Na ........................ G06F 3/0448
(Continued)

FOREIGN PATENT DOCUMENTS

CN 103941910 A 7/2014
CN 104111748 A 10/2014
(Continued)

OTHER PUBLICATIONS

English Translation of KR 20190023866 (Year: 2018).*
(Continued)

*Primary Examiner* — Patrick N Edouard
*Assistant Examiner* — Eboni N Giles
(74) *Attorney, Agent, or Firm* — Fish & Richardson P.C.

(57) ABSTRACT

A touch display panel for improving product yield and product reliability and reducing manufacturing cost includes a touch sensor unit disposed on an encapsulation unit, the touch sensor unit including a plurality of touch sensors corresponding to an active area and a touch passivation layer on the plurality of touch sensors, and an antireflection unit disposed on the touch sensor unit, the antireflection unit at least including a black matrix disposed in non-emissive areas of the active area and a bezel area, wherein the antireflection unit and the touch passivation layer overlap the active area and the bezel area and do not overlap at least a pad area of the bezel area, and, in the bezel area, the overlapping area of the antireflection unit is equal to the overlapping area of the touch passivation layer.

18 Claims, 13 Drawing Sheets

(51) Int. Cl.
  *H10K 50/84* (2023.01)
  *H10K 50/86* (2023.01)
  *H10K 59/131* (2023.01)
  *H10K 59/38* (2023.01)
  *H10K 59/40* (2023.01)

(52) U.S. Cl.
  CPC ......... *H10K 50/865* (2023.02); *H10K 59/131* (2023.02); *H10K 59/38* (2023.02); *H10K 59/40* (2023.02); *G06F 2203/04112* (2013.01)

(58) Field of Classification Search
  CPC ............... G06F 3/041662; G06F 3/042; G06F 2203/04103; G06F 2203/04111; H01L 27/322; H01L 27/323; H01L 27/3276; H01L 51/524; H01L 51/5284; H01L 27/3223; H01L 51/5253; H01L 27/3216
  See application file for complete search history.

(56) References Cited

U.S. PATENT DOCUMENTS

| | | | | |
|---|---|---|---|---|
| 2019/0129539 A1* | 5/2019 | Kim | ...................... | G06F 3/0412 |
| 2019/0179466 A1* | 6/2019 | Kim | ...................... | H10K 59/35 |
| 2019/0326361 A1* | 10/2019 | Gwon | .................... | H10K 59/38 |

FOREIGN PATENT DOCUMENTS

| | | |
|---|---|---|
| CN | 106909251 A | 6/2017 |
| CN | 107065322 A | 8/2017 |
| CN | 108241449 A | 7/2018 |
| CN | 110021635 A | 7/2019 |
| CN | 110400823 A | 11/2019 |
| KR | 10-2006-0068035 A | 6/2006 |
| KR | 10-2006-0088242 A | 8/2006 |
| KR | 10-2017-0077791 A | 7/2017 |
| KR | 10-2017-0083668 A | 7/2017 |
| KR | 10-2018-0124607 A | 11/2018 |
| KR | 10-2019-0023866 A | 3/2019 |
| KR | 10-2019-0069240 A | 6/2019 |
| KR | 10-2019-0074022 A | 6/2019 |

OTHER PUBLICATIONS

Korean Office Action dated Aug. 2, 2022 issued in counterpart Patent Application No. 10-2022-0069396 (5 pages).
Chinese Office Action dated Aug. 1, 2023 issued in Patent Application No. 202011519708.X w/English Translation (9 pages).
Chinese Notice of Allowance dated Jan. 4, 2024 issued in Patent Application No. 202011519708.X (5 pages).

* cited by examiner

TOUCH DISPLAY PANEL

CROSS-REFERENCE TO RELATED APPLICATION

This application claims the benefit of Korean Patent Application No. 10-2019-0176063, filed on Dec. 27, 2019, which is incorporated by reference in its entirety.

BACKGROUND

Field of the Disclosure

The present disclosure relates to a touch display panel capable of improving product yield and product reliability while reducing manufacturing cost.

Description of the Background

A touch sensor configured to allow information to be input by user touch on the screen of a display is applied to various display devices, such as laptop computers, monitors, and electric home appliances, as well as portable information devices, such as smartphones and tablets.

Although a touch sensor is generally manufactured in the form of a touch panel, which is attached to a display panel, development has been conducted toward a system in which the touch sensor is mounted in the display panel in order to simplify a display device and to reduce manufacturing cost.

There is a necessity for a touch display panel having a touch sensor mounted therein that is capable of improving product yield and product reliability while reducing manufacturing cost.

SUMMARY

Accordingly, the present disclosure is directed to a touch display panel that substantially obviates one or more problems due to limitations and disadvantages of the related art.

One or more aspects of the present disclosure provides a touch display panel capable of improving product yield and product reliability while reducing manufacturing cost.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

A touch display panel according to an aspect includes a display unit including an active area, in which a plurality of pixels is disposed, and a bezel area adjacent to the active area, an encapsulation unit disposed on the display unit, the encapsulation unit being configured to seal the plurality of pixels, a touch sensor unit disposed on the encapsulation unit, the touch sensor unit including a plurality of touch sensors corresponding to the active area and a touch passivation layer on the plurality of touch sensors, and an antireflection unit disposed on the touch sensor unit, the antireflection unit at least including a black matrix disposed in non-emissive areas of the active area and the bezel area. The antireflection unit and the touch passivation layer overlap the active area and the bezel area and do not overlap at least a pad area of the bezel area, and, in the bezel area, the overlapping area of the antireflection unit is equal to the overlapping area of the touch passivation layer.

In the bezel area, the non-overlapping area of the antireflection unit may be equal to the non-overlapping area of the touch passivation layer.

In an aspect of the present disclosure, the antireflection unit may include the black matrix, a color filter overlapping an emissive area of each of the pixels, and an organic passivation layer disposed on the touch passivation layer so as to cover the black matrix and the color filter, wherein, in the bezel area, the overlapping area of the organic passivation layer may be equal to the overlapping area of the touch passivation layer.

In another aspect of the present disclosure, the antireflection unit may include the black matrix and an organic passivation layer disposed on the touch passivation layer so as to cover the black matrix, wherein, in the bezel area, the overlapping area of the organic passivation layer may be equal to the overlapping area of the touch passivation layer.

In a further aspect of the present disclosure, the antireflection unit may include the black matrix and a color filter overlapping an emissive area of each of the pixels, wherein, in the bezel area, the overlapping area of the black matrix may be equal to the overlapping area of the touch passivation layer.

In the bezel area, the overlapping area of the black matrix of the antireflection unit may be equal to the overlapping area of the touch passivation layer.

The touch passivation layer may have a recess located between adjacent black matrix portions.

The touch display panel may further include an overcoat layer disposed on the antireflection unit, the overcoat layer being configured to provide a flat surface.

The touch display panel may further include a crack prevention layer disposed in a bending area located in the bezel area, a touch routing line connected to each of the touch sensors, the touch routing line being disposed in the bezel area, a touch link line connected to the touch routing line in a jumping unit adjacent to the bending area, the touch link line being disposed so as to extend via a lower part of the crack prevention layer, and a touch pad connected to the touch link line, the touch pad being disposed in the pad area, wherein the antireflection unit and the touch passivation layer may not overlap the bending area and the pad area of the bezel area.

The touch routing line may be connected to the touch link line via a first contact hole in the jumping unit, the first contact hole may be formed through at least one insulating layer under the touch passivation layer and may expose the side surface of a first end of the crack prevention layer, the touch routing line may be located on the first end of the crack prevention layer while overlapping the first contact hole, and side edges of the antireflection unit and the touch passivation layer may coincide with each other in the jumping unit.

In the bezel area, the black matrix may commonly overlap the touch routing lines or may individually overlap the touch routing lines.

In the case in which the black matrix individually overlaps the touch routing lines, a recess may be formed in the touch passivation layer between adjacent black matrix portions and an insulating layer thereunder.

The touch pad may include a lower touch pad connected to the touch link line and an upper touch pad connected to the lower touch pad via a second contact hole in the pad area, the second contact hole may be formed through at least one insulating layer and may expose a second side surface of the crack prevention layer, and the upper touch pad may be located on a second end of the crack prevention layer and the end of the insulating layer while overlapping the second contact hole.

Each of the touch link line and the lower touch pad may be formed of an identical metal on an identical layer to one electrode belonging to the display unit, and each of the touch routing line and the upper touch pad may be formed of an identical metal on an identical layer to one electrode belonging to the touch sensor unit.

The display unit may include a circuit element layer comprising a plurality of thin film transistors (TFTs) and a light-emitting element layer including a plurality of light-emitting elements disposed on the circuit element layer, the encapsulation unit may be disposed on the circuit element layer so as to seal the light-emitting element layer, and the touch link line and the lower touch pad may be formed of identical metals on identical layers to a source electrode and a drain electrode of each of the TFTs.

The touch sensor unit may include a touch buffer layer on the encapsulation unit, a bridge metal layer including a plurality of first bridge electrodes on the touch buffer layer, a touch insulating layer disposed on the touch buffer layer so as to cover the bridge metal layer, a sensor metal layer including a plurality of first touch electrodes and a plurality of second touch electrodes disposed on the touch insulating layer, the first touch electrodes and the second touch electrodes constituting a plurality of touch sensors, the first touch electrodes and the second touch electrodes being spaced apart from each other, adjacent second touch electrodes being interconnected via second bridge electrodes, and adjacent first touch electrodes being connected to each other via a contact hole formed in the touch insulating layer and each of the first bridge electrodes, and a touch passivation layer disposed on the touch insulating layer so as to cover the sensor metal layer, wherein each of the touch routing line and the upper touch pad may be formed of an identical metal layer to the sensor metal layer.

The touch routing line may include an upper routing line and a lower routing line overlapping each other in the state in which the touch insulating layer is interposed therebetween, the upper routing line and the lower routing line being connected to each other via a contact hole formed in the touch insulating layer.

The first touch electrodes, the second touch electrodes, and the second bridge electrodes may have a mesh pattern shape overlapping the non-emissive area, and the first bridge electrodes may have a mesh pattern shape or a line pattern shape overlapping the non-emissive area.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
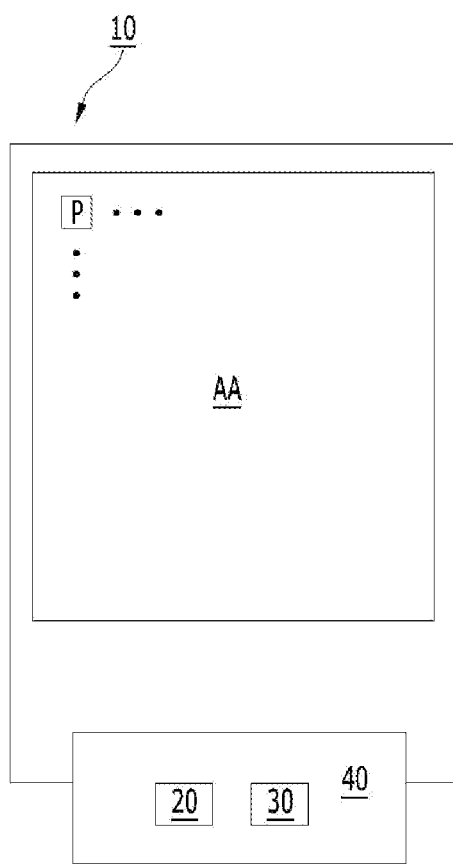
FIG. 1 is a plan view of a touch display device according to an aspect of the present disclosure.
Figure 2:
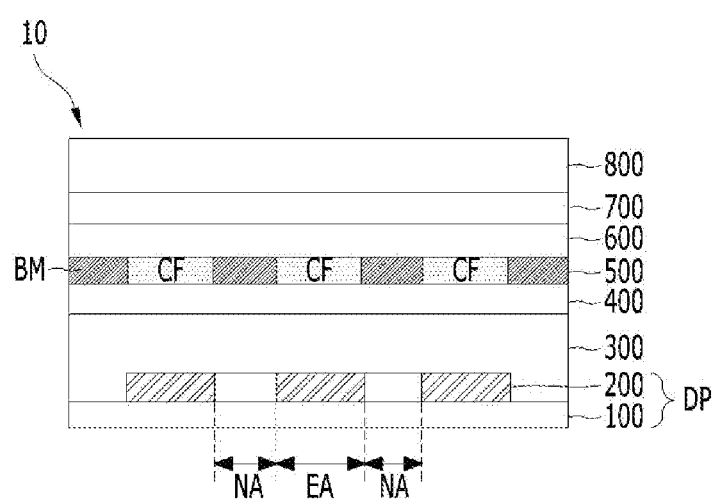
FIG. 2 is a cross-sectional view of a touch display panel according to an aspect of the present disclosure.

FIG. 1 is a plan view of a display device according to an aspect of the present disclosure, and FIG. 2 is a cross-sectional view of a touch display panel according to an aspect of the present disclosure.

Referring to FIGS. 1 and 2, the display device according to the aspect of the present disclosure includes a touch display panel 10 and a circuit film 40, which includes drive units 20 and 30 connected to the touch display panel 10.

The touch display panel 10 includes an active area AA having image display and touch sensing functions and a bezel area BZ located outside the active area AA. The active area AA may be referred to as a display area, a pixel matrix area, or a touch sensing area. The bezel area BZ may be referred to as a non-active area, a non-display area, or a touch non-sensing area.

The touch display panel 10 includes a display unit DP having an image display function, an encapsulation unit 300 disposed on the display unit DP so as to seal a light-emitting element layer 200, a touch sensor unit 400 disposed on the encapsulation unit 300, the touch sensor unit 400 having a touch sensing function, and an antireflection unit 500 disposed on the touch sensor unit 400, the antireflection unit having a function of preventing the reflection of external light. In addition, the touch display panel 10 may further include an optical film 600 attached to the antireflection unit 500, an optically clear adhesive (OCA) 700, and a cover substrate 800, and may further include a protective film. The optical film 600 may include a transmittance control film.

The display unit DP displays an image through a pixel array having a structure in which a circuit element layer 100 including a plurality of thin film transistors (TFTs) and a light-emitting element layer 200 including a plurality of light-emitting elements are stacked. Each light-emitting element may emit red light, green light or blue light for each pixel, or may emit white light.

The encapsulation unit 300 seals the light-emitting element layer 200 on the circuit element layer 100 in order to prevent the permeation of external moisture and oxygen and to prevent the introduction and movement of particles, thereby protecting the light-emitting element layer 200.

The touch sensor unit 400 may use a capacitance scheme in which a signal having capacitance variation by user touch reflected therein is provided to a touch drive unit. The touch sensor unit may use a self-capacitance scheme in which a signal having capacitance variation of each touch electrode reflected therein is independently provided to the touch drive unit 30 or a mutual-capacitance scheme in which a signal having capacitance variation between first and second touch electrodes reflected therein is provided to the touch drive unit 30. In the following aspects, a mutual-capacitance type touch sensor unit will be described by way of example.

Since the encapsulation unit 300, the thickness of which is large, is disposed between the display unit DP and the touch sensor unit 400, parasitic capacitance between the touch sensor unit 400 and the display unit DP is reduced, and touch sensing performance is sufficiently secured.

The circuit film 40, on which the display drive unit 20 and the touch drive unit 30 are mounted, is connected to a pad area of the touch display panel 10 via an anisotropic conductive film. The circuit film 40 may be one of a chip on film (COF), a flexible printed circuit (FPC), and a flexible flat cable (FFC).

The display drive unit 20 may include a data drive unit, a timing controller, and a gamma voltage generation unit configured to drive the display unit DP of the touch display panel 10. A gate drive unit configured to drive gate lines of the display unit DP may be mounted in the bezel area BZ of the touch display panel 10. Meanwhile, the display drive unit 20 may be mounted on the pad area of the touch display panel 10.

The touch drive unit 30 may drive the touch sensor unit 400, may generate sensing data using readout signals output from the touch sensor unit 400, and may output the generated sensing data to a touch controller. The touch controller may detect a touched area and touch coordinates of the touched area based on the sensing data, and may provide the same to a host system.

The antireflection unit 500, which is disposed on the touch sensor unit 400, includes a color filter CF overlapping an emissive area EA of each pixel, the color filter being configured to transmit red light, green light, or blue light for each pixel, and a black matrix BM overlapping a non-emissive area NA, the black matrix being configured to absorb external light. The antireflection unit 500 exhibits a light wavelength selection property and an external light absorption property, whereby it is possible to reduce the reflectance of external light by the touch sensor unit 400 and the display unit DP.

Meanwhile, the antireflection unit 500 may be configured to include only the black matrix BM, which absorbs external light, without the color filter CF in order to reduce the reflectance of external light.

The antireflection unit 500 may further include an organic passivation layer configured to cover the color filter CF and the black matrix BM or to cover the black matrix BM, and may further include an overcoat layer configured to provide a flat surface.

A touch passivation layer configured to protect touch sensors of the touch sensor unit 400 may remain in the state of overlapping a bending area and a pad area that do not overlap the antireflection unit 500 while the antireflection unit 500 is formed thereon. When the antireflection unit 500 is formed through a patterning process using a developing solution, therefore, the end of a touch routing line and the end of a pad located in the bending area and the pad area may be protected from the developing solution of the antireflection unit 500 by the touch passivation layer thereon.

In addition, the touch passivation layer in the bending area and the pad area exposed through the antireflection unit 500 may be removed by a dry etching method using the antireflection unit 500 as a mask, whereby a mask process for patterning the touch passivation layer is unnecessary and thus manufacturing cost may be reduced. In the bezel area, the overlapping area of the antireflection unit 500 is equal to the overlapping area of the touch passivation layer.

Figure 3:
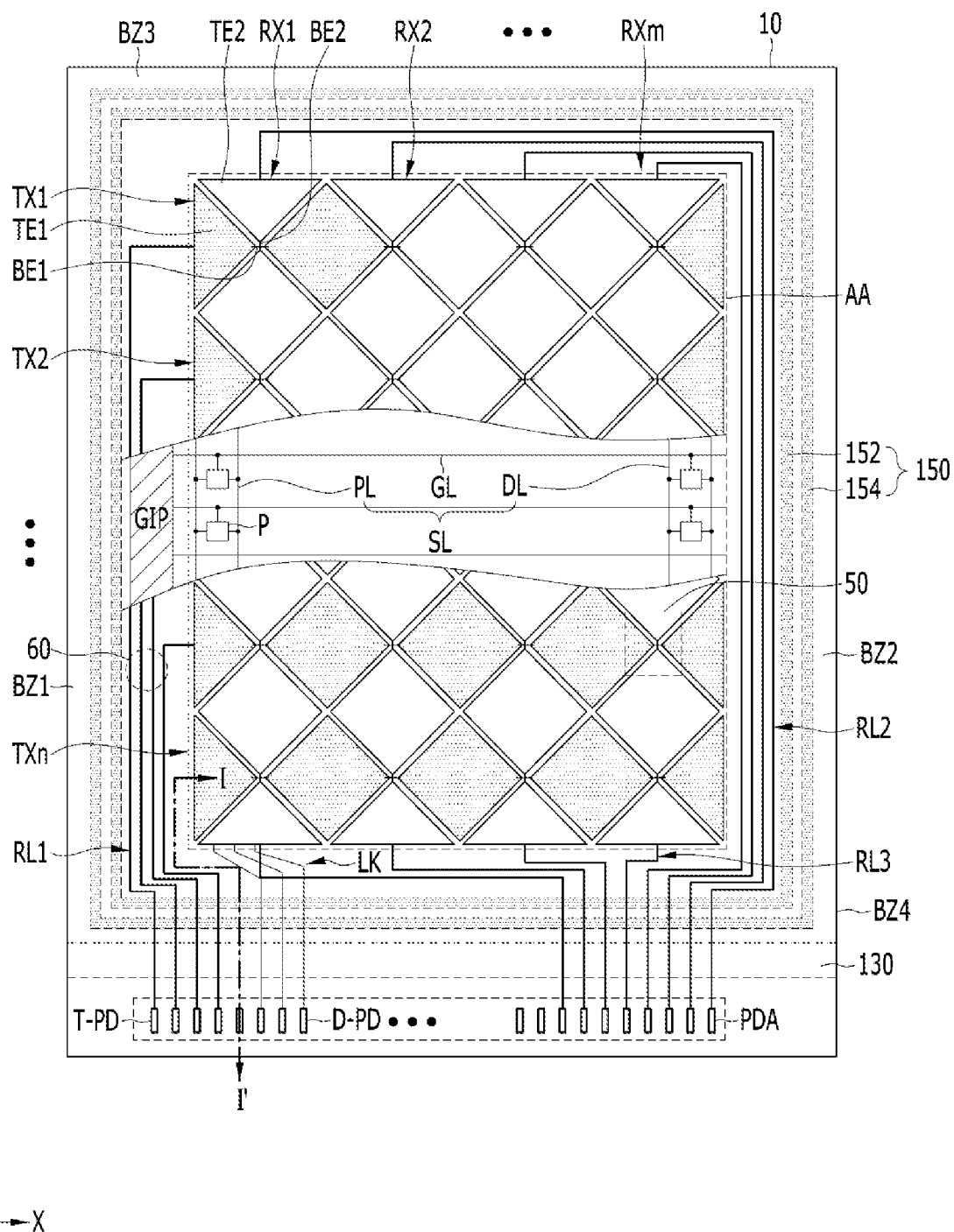
FIG. 3 is a plan view of the touch display panel according to the aspect, from which an antireflection unit is removed.

FIG. 3 is a plan view of the touch display panel according to the aspect of the present disclosure, partially showing the touch sensor unit and the display unit excluding the antireflection unit. A description will be given with reference to FIG. 3 together with FIGS. 1 and 2.

A pixel array including a plurality of pixels P configured to display an image and a plurality of signal lines SL is disposed in the active area AA of the display unit DP. The plurality of pixels P include red, green, and blue pixels, and may further include a white pixel configured to improve luminance. Each pixel P is connected to a plurality of signal lines SL including a gate line GL, a data line DL, and a power line PL. Each pixel P includes a light-emitting element and a pixel circuit configured to independently drive the light-emitting element. An organic light-emitting diode, a quantum-dot light-emitting diode, or an inorganic light-emitting diode may be used as the light-emitting element. Hereinafter, the organic light-emitting diode will be described by way of example. The pixel circuit may include a plurality of TFTs, at least including a drive TFT and a switching TFT, and a storage capacitor. The display unit DP has a structure in which a circuit element layer 100 including a plurality of pixel circuits disposed in the active area AA and a light-emitting element layer 200 including a plurality of light-emitting elements disposed in the active area AA are stacked.

The circuit element layer 100 located in the bezel area BZ (BZ1 to BZ4) of the display unit DP includes a plurality of link lines LKs connected to the active area AA and lower pads of a plurality of pads D-PD and T-PD. The link lines LK in the bezel area may include signal lines and power supply lines connected to the signal lines GL, DL, and PL in the active area AA.

A plurality of display pads D-PD configured to connect the link lines LK and the display drive unit 20 to each other is disposed in a pad area PDA provided in the fourth bezel area BZ4, which is a portion of the bezel area BZ, and a plurality of touch pads T-PD connected to the touch sensor unit 400 is further disposed therein. Each of the display pads D-PD and the touch pads T-PD includes a lower pad and an upper pad connected to each other via a contact hole formed in at least one insulating layer. The lower pad of each pad D-PD or T-PD is formed of the same metal layer as at least one metal layer located in the circuit element layer 100 of the display unit DP, and the upper pad may be formed of the same metal layer as at least one metal layer located in the touch sensor unit 400.

A gate drive unit GIP configured to drive the plurality of gate lines GL in the active area AA may be disposed in at least one of the first bezel area BZ1 and the second bezel area BZ2 of the display unit DP. The gate drive unit GIP, which includes a plurality of TFTs, may be formed in the circuit element layer together with the TFT array in the active area AA. The gate drive unit GIP may receive control signals and electric power from the display drive unit 20 via the link lines LK and the pads D-PD disposed in the fourth bezel area BZ4.

The fourth bezel area BZ4, which includes the pad area PDA, includes a bending area BD configured to be bent or folded, and the bending area GD includes a crack prevention layer 140 formed of an organic insulating material that exhibits high strain and impact resistance to alleviate bending stress. When the bezel is bent, the crack prevention layer 140 may alleviate bending stress applied to wires and insulating layers thereunder, whereby it is possible to prevent crack defects and open-circuit defects in the bending area BD.

The encapsulation unit 300 disposed on the display unit DP may overlap the entirety of the active area AA, may extend to the bezel areas BZ1 to BZ4, and may be disposed so as to overlap a dam unit 150 disposed in the bezel areas BZ1 to BZ4. The encapsulation unit 300 may protect the light-emitting element layer of the display unit DP by sealing.

The dam unit 150 may be disposed in the bezel areas BZ1 to BZ4 to prevent down streaming or collapse of an organic encapsulation layer of the encapsulation unit 300. For example, the dam unit 150 may include a plurality of closed loop-shaped dams 152 and 154 configured to surround the active area AA and an area including the gate drive unit GIP. The dam unit 150 is disposed in the bezel area BZ4, which includes the bending area BD and the pad area PDA, between the active area AA and the bending area BD.

The touch sensor unit 400 on the encapsulation unit 300 includes a plurality of touch electrodes TE1 and TE2 and a plurality of bridge electrodes BE1 and BE2 disposed in the active area AA to provide capacitance type touch sensors. The touch sensor unit 400 includes a plurality of touch routing lines RL1, RL2, and RL3 disposed in the bezel areas BZ1 to BZ4. The touch sensor unit 400 includes an upper pad of each of the plurality of touch pads T-PD and the plurality of display pads D-PD in the pad area PDA, which is provided in the bezel area BZ4.

The touch sensor unit 400 includes a plurality of first touch electrode channels TX1 to TXn constituted by a plurality of first touch electrodes TE1 electrically connected to each other while being arranged in the active area AA in a first direction (an X-axis direction or a horizontal direction) and a plurality of second touch electrode channels RX1 to RXm constituted by a plurality of second touch electrodes TE2 electrically connected to each other while being arranged in the active area AA in a second direction (a Y-axis direction or a vertical direction). A first touch electrode TE1 and a second touch electrode TE2 adjacent to each other may constitute a mutual-capacitance type touch sensor.

Each of the first touch electrodes TE1 arranged in the first direction X in each first touch electrode channel TXi (i=1, . . . , n) is connected to a first touch electrode TE1 adjacent thereto via a first bridge electrode BE1. Each of the second touch electrodes TE2 arranged in the second direction Y in each second touch electrode channel RXi (i=1, . . . , m) is connected to a second touch electrode TE2 adjacent thereto via a second bridge electrode BE2. The first touch electrodes TE1 may be referred to as transmission electrodes Tx, and the second touch electrodes TE2 may be referred to as reception electrodes Rx. The first touch electrode channels TX1 to TXn may be referred to as transmission channels, and the second touch electrode channels RX1 to RXm may be referred to as reception channels or readout channels. Each of the first and second touch electrodes TE1 and TE2 is mainly formed so as to have a diamond shape. Alternatively, each of the first and second touch electrodes TE1 and TE2 may be formed so as to have any of various other polygonal shapes.

The plurality of touch routing lines RL1, RL2, and RL3, which is disposed in the bezel areas BZ1 to BZ4 of the touch sensor unit 400, connects the touch electrode channels TX1 to TXn and RX1 to RXm in the active area AA to the plurality of touch pads T-PD for each channel. The touch routing lines RL1, RL2, and RL3 may be disposed in the bezel areas BZ1 to BZ4 so as to be located further inwards than the dam unit 150, and may extend over the dam unit 150 so as to be connected to the touch pads T-PD in the fourth bezel area BZ4.

One-side ends of the plurality of first touch electrode channels TX1 to TXn disposed in the active area AA may be connected to the touch drive unit 30 via the plurality of first touch routing lines RL1 and the touch pads T-PD disposed in the plurality of bezel areas BZ1 and BZ4.

Opposite-side ends of the plurality of second touch electrode channels RX1 to RXm disposed in the active area AA may be connected to the touch drive unit 30 via the plurality of second touch routing lines RL2, the plurality of third touch routing lines RL3, and the touch pads T-PD disposed in the plurality of bezel areas BZ2, BZ3, and BZ4. Since the second touch electrode channels RX1 to RXm, which may be used as readout channels, are longer than the first touch electrode channels TX1 to TXn, opposite-side ends of each second touch electrode channel RXi may be connected to the touch drive unit via the second and third touch routing lines RL2 and RL3, whereby it is possible to reduce RC delay and to improve touch sensing performance.

The touch drive unit 30 may drive the plurality of first touch electrode channels TX1 to TXn, may receive readout signals output from the plurality of second touch electrode channels RX1 to RXm, and may generate sensing data using the readout signals. For example, the touch drive unit 30 may compare readout signals of two adjacent channels through a differential amplifier to generate a touch sensing signal indicating whether touch has been performed, may digitally convert the touch sensing signal into touch sensing data, and may output the touch sensing data to the touch controller.

Figure 4:
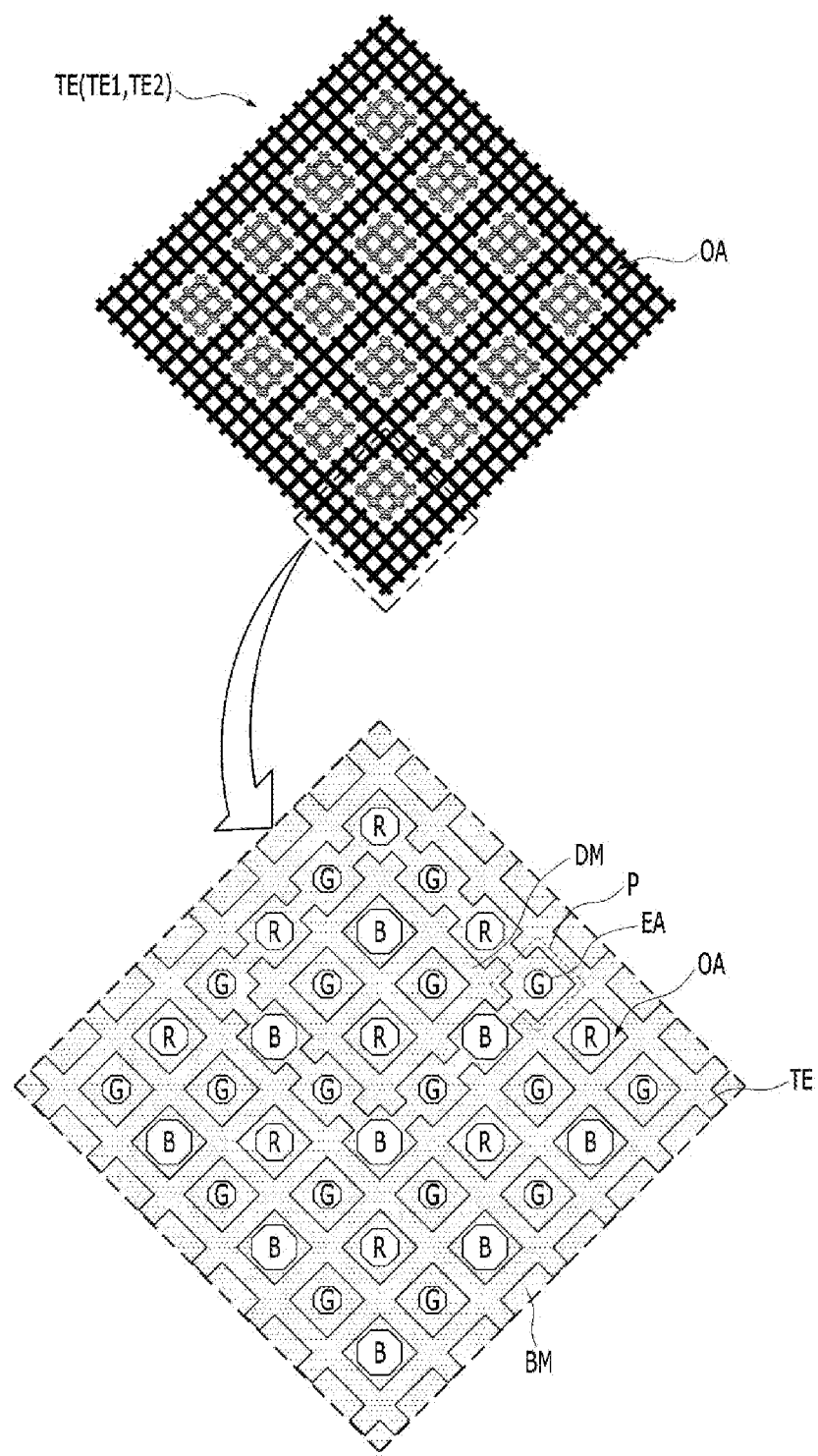
FIG. 4 is an enlarged plan view of a touch electrode according to an aspect of the present disclosure.
Figure 5:
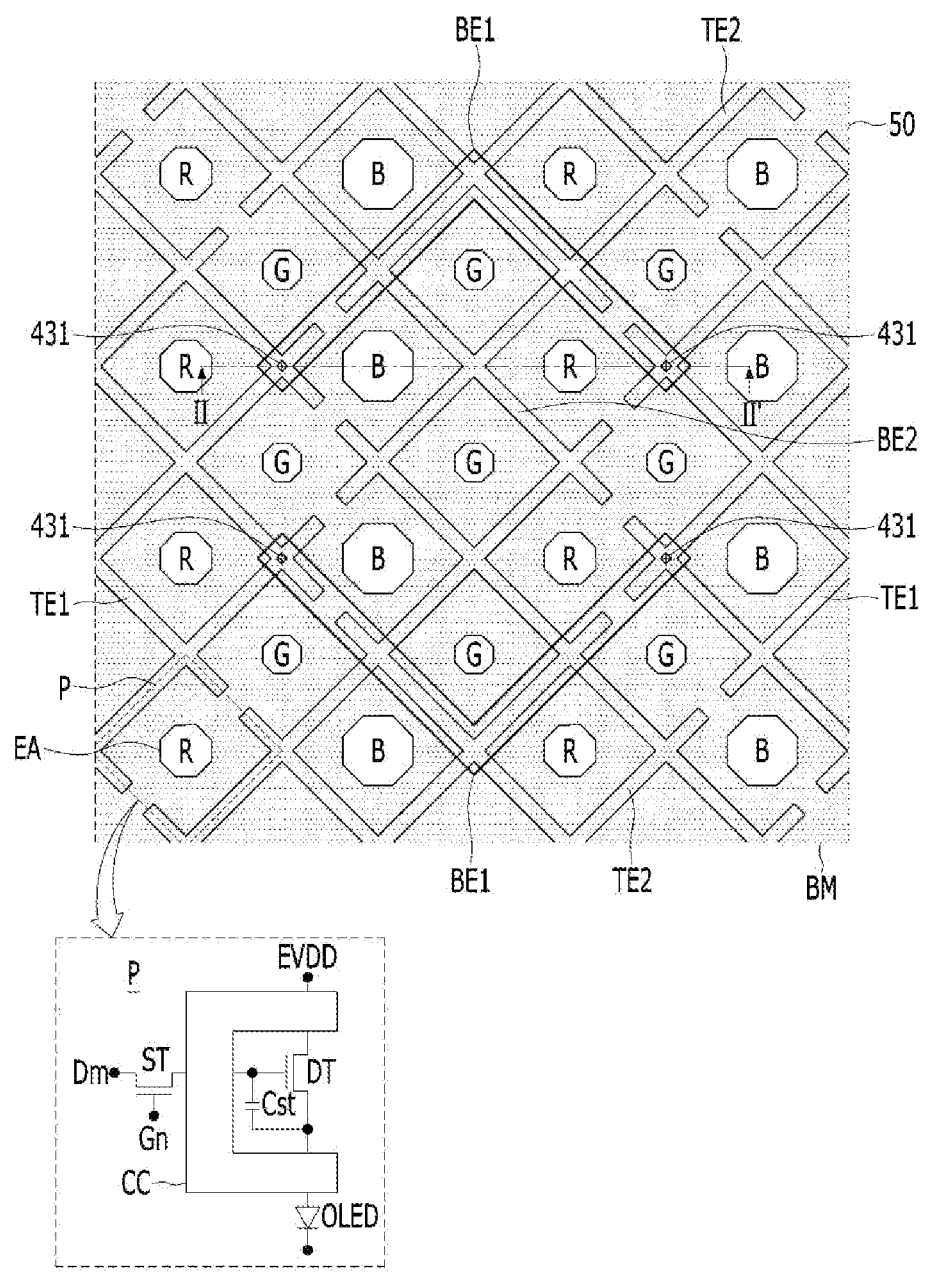
FIG. 5 is an enlarged plan view of a bridge electrode according to the aspect of the present disclosure shown in FIG. 3.

FIG. 4 is an enlarged plan view of a touch electrode according to an aspect of the present disclosure, and FIG. 5 is an enlarged plan view of a bridge electrode according to the aspect of the present disclosure shown in FIG. 3.

Referring to FIGS. 4 and 5, a touch electrode TE applied to each of the first and second touch electrodes TE1 and TE2 has a diamond shape of a size including a plurality of pixels P, and has a mesh pattern shape overlapping a non-emissive area of each pixel P. The touch electrode TE may have one of various shapes, such as a quadrangular shape and a circular shape, in addition to the diamond shape. The mesh-pattern-shaped touch electrode TE may have a plurality of openings OA configured to expose the emissive areas EA of the plurality of pixels P, and the plurality of openings OA may be disposed in a matrix. Each of the first and second bridge electrodes BE1 and BE2 also has a line pattern or mesh pattern shape overlapping the non-emissive area of each pixel P. Consequently, the mesh-pattern-shaped touch electrodes TE1 and TE2 and the mesh-pattern-shaped or line-pattern-shaped bridge electrodes BE1 and BE2 are disposed in only the non-emissive areas of the pixels P, whereby it is possible to prevent deterioration in aperture ratio and transmittance of the pixels.

The first and second touch electrodes TE1 and TE2 are constituted by the same sensor metal layers, and are disposed so as to be spaced apart from each other. In the first and second bridge electrodes BE1 and BE2, bridge electrodes of one layer are constituted by the same sensor metal layers as the touch electrodes TE1 and TE2, and bridge electrodes of the other layer are constituted by bridge metal layers different from the touch electrodes TE1 and TE2. For example, a second bridge electrode BE2 interconnecting adjacent second touch electrodes TE2 may be constituted by a sensor metal layer integrated with the second touch electrodes TE2, and may have a mesh pattern shape. A first bridge electrode BE1 interconnecting adjacent first touch electrodes TE1 is constituted by a bridge metal layer having a touch insulating layer therebetween, overlaps a portion of each of the first touch electrodes TE1, and is connected to the first touch electrodes TE1 via a contact hole 431 in the touch insulating layer. The first bridge electrode BE1 may have a line pattern or mesh pattern shape in which the first bridge electrode partially overlaps the second bridge electrode BE2 or the second touch electrode TE in the state in which the touch insulating layer is interposed therebetween while being isolated from each other.

A mesh pattern of each touch electrode TE may further include at least one dummy pattern DM in which the mesh pattern is cut so as to electrically float, and the at least one dummy pattern DM may also have a mesh pattern shape. The floating dummy pattern DM may further reduce parasitic capacitance between the touch sensor unit and the display unit, between which the encapsulation unit is interposed, in the active area AA, whereby it is possible to improve touch sensing performance. For example, it is possible to reduce parasitic capacitance between the mesh pattern of the touch electrode TE and a common electrode of the light-emitting element layer through the floating dummy pattern DM.

The plurality of pixels P include red (R), green (G), and blue (B) pixels, and may further include a white pixel configured to improve luminance. The emissive area EA of each pixel P overlaps R, G, and G color filters of the antireflection unit disposed on the touch sensor unit, and the non-emissive area overlaps the black matrix BM of the antireflection unit. It is not necessary for the emissive areas EA of the pixels P to have the same area. For example, the emissive areas EA of the pixels P may be smaller in order of blue (B)>red (R)>green (G).

Each pixel P includes a light-emitting element OLED disposed in the emissive area EA and a pixel circuit configured to independently drive the light-emitting element OLED, the pixel circuit being disposed over the emissive area EA and the non-emissive area.

The light-emitting element OLED of each pixel P may generate red light, green light, or blue light, or a plurality of light-emitting elements OLED constituting the plurality of pixels P may commonly generate white light.

The pixel circuit at least includes a storage capacitor Cst configured to store drive voltage, a drive TFT DT configured to supply current from a high-potential power line EVDD to the light-emitting element OLED while controlling the amount of current depending on the drive voltage stored in the storage capacitor Cst, and a switching TFT ST configured to provide a data signal of a data line Dm to the storage capacitor Cst in response to a gate signal of a gate line Gn. In addition, the pixel circuit may further include a control circuit CC constituted by a plurality of TFTs configured to initialize three electrodes (gate, source, and drain) of the drive TFT DT, to connect the drive TFT DT in a diamond structure in order to compensate for threshold voltage, or to control light-emission time of the light-emitting element OLED. A first electrode (anode) of the light-emitting element OLED may be connected to the drive TFT DT, and a second electrode (cathode) may be connected to a common electrode which is shared by a plurality of pixels and to which low-potential power voltage EVSS is supplied. Various constructions, such as 2T1C (two TFTS and one capacitor), 3T1C (three TFTS and one capacitor), and 7T1C (seven TFTS and one capacitor), may be applied to the pixel circuit.

Figure 6:
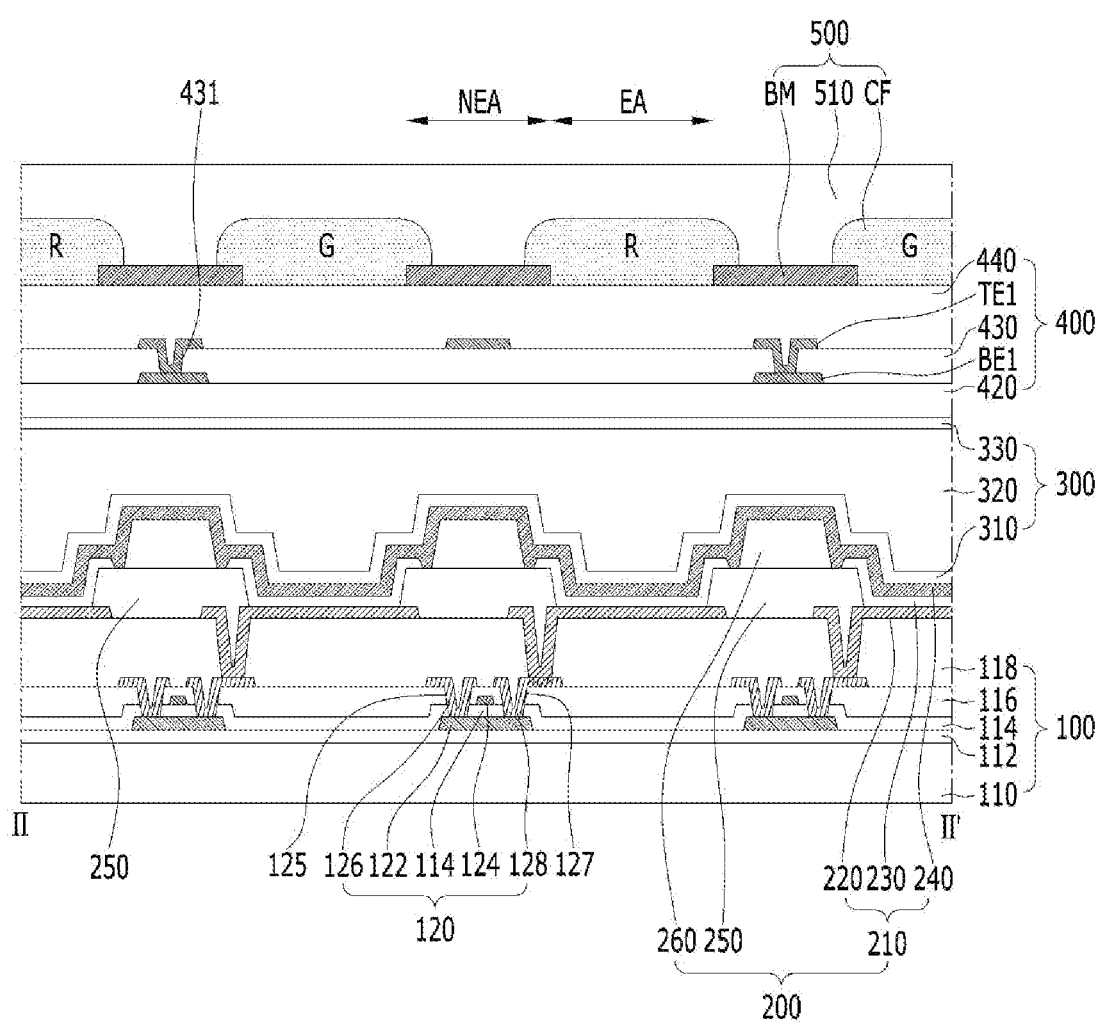
FIGS. 6 and 7 are cross-sectional views of the touch display panel according to the aspect of the present disclosure taken along dot-long dash line II-II' of FIG. 5.
Figure 7:
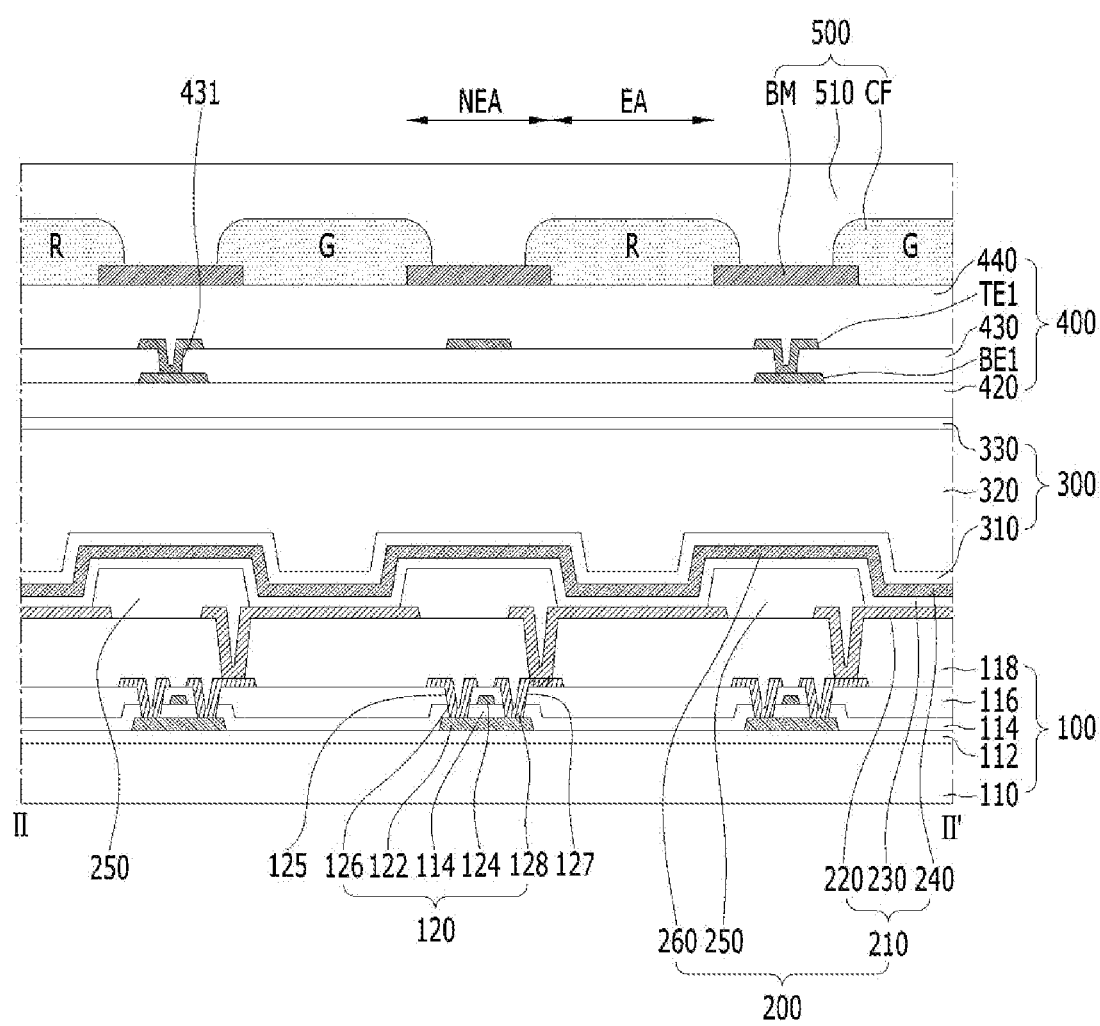
Figure 8:
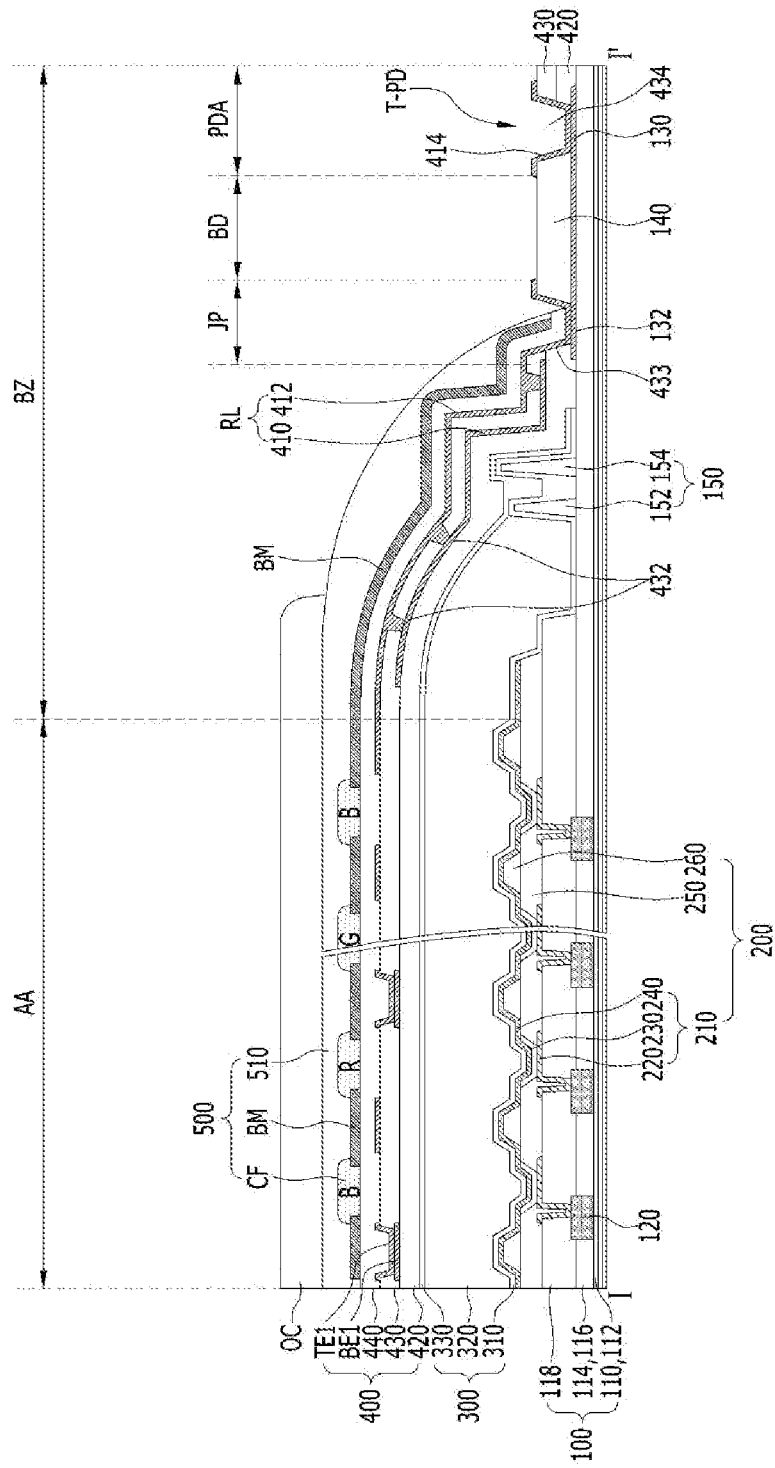
FIG. 8 is a cross-sectional view of the touch display panel according to the aspect of the present disclosure taken along dot-long dash line I-I' of FIG. 3.
Figure 9:
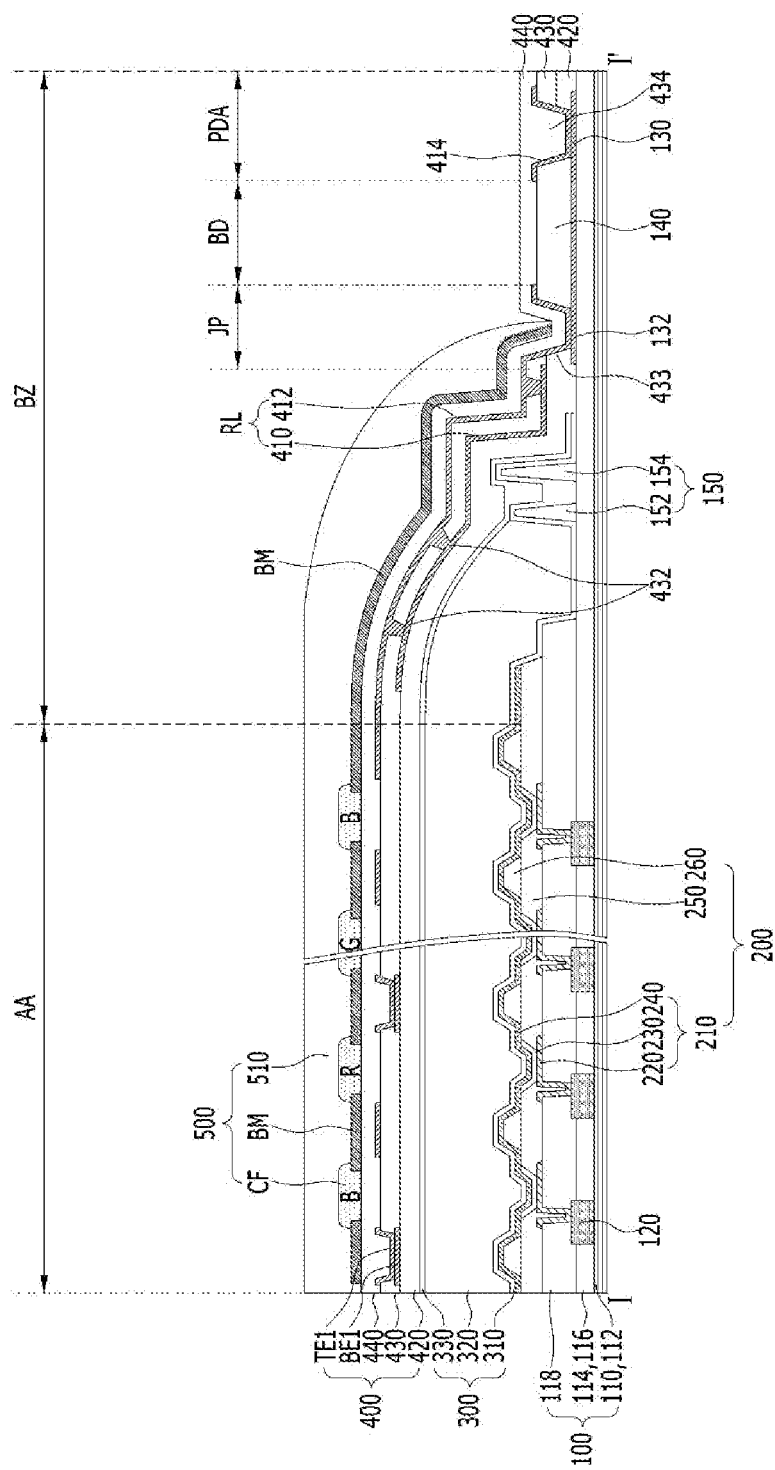
FIG. 9 is a cross-sectional view of a touch passivation layer of the touch display panel shown in FIG. 8 before etching.

Each of FIGS. 6 and 7 is a cross-sectional view of the touch display panel according to the aspect of the present disclosure taken along dot-long dash line II-IF of FIG. 5, FIG. 8 is a cross-sectional view of the touch display panel according to the aspect taken along dot-long dash line I-I' of FIG. 3, and FIG. 9 is a cross-sectional view of a touch passivation layer of the touch display panel according to the aspect of the present disclosure before patterned.

Referring to FIGS. 6 to 8, the touch display panel includes a circuit element layer 100 including a plurality of TFTs 120, a light-emitting element layer 200 including a plurality of light-emitting elements 210 disposed on the circuit element layer 100, an encapsulation unit 300 disposed on the circuit element layer 100 so as to seal the light-emitting element layer 200, a touch sensor unit 400 including a plurality of touch sensors disposed on the encapsulation unit 300, and an antireflection unit 500 disposed on the touch sensor unit 400.

The circuit element layer 100 includes a plurality of TFTs 120 disposed on a base substrate 110, the plurality of TFTs 120 is included in each pixel in the active area AA, and a drive circuit, such as a gate drive unit, disposed in the bezel area BZ may be further included. The circuit element layer 100 further includes a plurality of signal lines connected to the plurality of TFTs 120 and a storage capacitor. However, FIGS. 6 to 8 typically show a drive TFT 120 connected to a light emitting element 210 in each pixel P.

The base substrate 110 may include a plastic substrate or a glass substrate. The plastic substrate may be formed of a flexible material. For example, the base substrate 110 may include at least one of an acrylic-based resin, an epoxy-based resin, a siloxane-based rein, a polyimide-based resin, or a polyamide-based resin, which is an organic insulating material.

A buffer layer 112 may be disposed between the base substrate 110 and the plurality of TFTs 120. The buffer layer 112 may prevent impurities, such as hydrogen, from being introduced into a semiconductor layer 122 of the TFT 120 through the base substrate 110. The buffer layer 112 may include an organic insulating material or an inorganic insulating material. For example, the buffer layer 112 may include an oxide-based insulating material, such as silicon oxide (SiOx) or aluminum oxide (Al2O3). Meanwhile, a barrier layer capable of preventing introduction of particles may be further disposed between the base substrate 110 and the buffer layer 112. The buffer layer 112 and the barrier layer are disposed in the active area AA and the bezel area BZ.

Each of the plurality of TFTs 120 includes a semiconductor layer 122, a gate insulating layer 114, a gate electrode 124, an interlayer insulating layer 116, a first electrode 126, and a second electrode 128. One of the first electrode 126 and the second electrode 128 may be a source electrode, and the other may be a drain electrode.

The gate electrode 124, the first electrode 126, and the second electrode 128 of each TFT 120 may be formed in a single layer structure or a multilayer structure including one or an alloy of at least two of molybdenum (Mo), aluminum (Al), chromium (Cr), gold (Au), titanium (Ti), nickel (Ni), copper (Cu), neodymium (Nd), and tungsten (W).

The semiconductor layer 122 may be formed of one of an amorphous semiconductor material, a polycrystalline semiconductor material, and an oxide semiconductor material. Meanwhile, the drive TFT 120, which is one of the TFTs belonging to each pixel P, may include a polycrystalline semiconductor layer, and each of the other TFTs may include an oxide semiconductor layer.

Each of the gate insulating layer 114 and the interlayer insulating layer 116 may be formed in a single layer structure or a multilayer structure including at least one of an oxide-based insulating material or a nitride-based insulating material. The gate insulating layer 114 and the interlayer insulating layer 116 may be disposed in the active area AA and the bezel area BZ.

The gate electrode 124 is disposed on the gate insulating layer 114, which covers the semiconductor layer 122, so as to overlap the semiconductor layer 122. The first electrode 126 and the second electrode 128 formed on the interlayer insulating layer 116, which covers the gate electrode 124, are connected to the semiconductor layer 122 via contact holes 125 and 127 formed in the interlayer insulating layer 116 and the gate insulating layer 114.

A light-shielding layer overlapping the semiconductor layer 122 to prevent external light from being incident on the semiconductor layer 122 may be further provided between the buffer layer 112 and the semiconductor layer 122. The light-shielding layer may be formed of a conductive material, and may serve as a lower gate electrode, which is one of dual gate electrodes overlapping the semiconductor layer 122 above and under the semiconductor layer 122.

The circuit element layer 100 further includes a planarization layer 118 configured to cover the TFT 120 and to provide a flat surface to the light-emitting element layer 200, and further includes a crack prevention layer 140 disposed in the bending area BD of the bezel area BZ. The planarization layer 118 has a contact hole 129, through which the second electrode 128 of the TFT 120 is exposed. Each of the planarization layer 118 and the crack prevention layer 140 may be formed of an organic insulating material, and the organic insulating material may include one of the above organic insulating materials. The planarization layer 118 may be disposed in the active area AA, and may extend to a portion of the bezel area BZ adjacent to the active area AA. The crack prevention layer 140 is disposed in the bending area BD of the bezel area BZ between the active area AA and the pad area PDA. The crack prevention layer 140, which is formed of an organic material, may alleviate bending stress applied to the bending area BD when the bezel is bent, whereby it is possible to prevent crack defects in the bending area BD.

A light-emitting element layer 200 including a light-emitting element 210 and a bank 250 is formed on the planarization layer 118. The light-emitting element layer 200 may further include a spacer 260 disposed on the bank 250. The light-emitting element layer 200 is disposed in the active area AA, and the bank 250 may extend to a portion of the bezel area BZ.

The light-emitting element 210 may include a first electrode 220 connected to the TFT 120, a light-emitting stack 230 or 230A, and a second electrode 240. One of the first electrode 220 and the second electrode 240 may be an anode, and the other may be a cathode. The first electrode 220 may be independently separated and disposed for each pixel P, and the second electrode 240 may be a common electrode that is commonly disposed in the plurality of pixels P and is connected along the surfaces of the bank 250 and the spacer.

The first electrode 220 is disposed on the planarization layer 118, and is connected to the second electrode 128 of the TFT 120 via the contact hole 129 formed through the planarization layer 118. The first electrode 220 may be formed in a structure including a plurality of conductive layers exhibiting high reflectance. For example, the first electrode 220 may be formed in a stack structure (Ti/Al/Ti) of aluminum (Al) and titanium (Ti), a stack structure (ITO/Al/ITO) of aluminum (Al) and indium tin oxide (ITO), or a stack structure (ITO/APC/ITO) of APC and ITO. APC is an alloy of silver (Ag), palladium (Pd), and copper (Cu).

A bank 250 which has an opening configured to expose the first electrode 220 and is configured to cover the end of the first electrode 220 is disposed on the planarization layer 118 having the first electrode 220 formed thereon. The opening of the bank 250 may be defined as an emissive area, and the area in which the bank 250 is disposed may be defined as a non-emissive area. The bank 250, which surrounds the emissive area, may be formed in a single layer structure or a double layer structure. A spacer 260 having an opening wider than the opening of the bank 250 may be further disposed on the bank 250. The spacer 260 may support a deposition mask when a light-emitting layer of the light-emitting stack 230 is formed. Each of the bank 250 and the spacer 260 may be formed of the above organic insulating material. The bank 250 includes a light-shielding material, whereby it is possible to prevent backlight bleeding between adjacent pixels and to reduce reflection of external light.

The light-emitting stack 230 may be formed by stacking a hole control layer, a light-emitting layer, and an electron control layer in that order or in reverse order. The hole control layer and the electron control layer are common layers that are commonly formed in the plurality of pixels P, and the light-emitting layer may be independently formed in the emissive area of each pixel P. The hole control layer may include at least a hole transport layer selected from between a hole injection layer and the hole transport layer, and the electron control layer may include at least an electron transport layer selected from between the electron transport layer and an electron injection layer. The light-emitting layer may generate one of red light, green light, and blue light, and may be formed in an emissive area of a corresponding pixel P through an opening of a fine metal mask (FMM), which is a deposition mask. The light-emitting layer 234 overlapping the first electrode 220 may be disposed so as to overlap the end of the bank 250.

Meanwhile, the light-emitting stack 230A shown in FIG. 7 may be commonly formed in the plurality of pixels P to generate white light. The light-emitting stack 230A may include a two stack structure in which a first light-emitting stack configured to generate blue light and a second light-emitting stack configured to generate yellow green light and red light are stacked in the state in which a charge generation layer is disposed therebetween in order to emit white light.

The second electrode 240 is disposed on the light-emitting stack 230 or 230A, and is also disposed on the bank 250 and the spacer 260, whereby the second electrode 240 may also be referred to a common electrode that is commonly formed in the plurality of pixels P. The second electrode 240 may be formed of a conductive material having high light transmittance or a semi-transmissive conductive material. For example, the second electrode 240 may be formed of a transparent conductive material, such as ITO or IZO. The second electrode 240 may be formed of a semi-transmissive metal material, such as magnesium (Mg), silver (Ag), or an alloy thereof. A capping layer may be further disposed on the second electrode 240 in order to improve light resonance and light emission efficiency of the light-emitting element 210. The second electrode 240 may be disposed over the entire active area AA, and may extend to the bezel area BZ so as to be connected to a power supply line disposed on another layer in the bezel area BZ.

The encapsulation unit 300 configured to seal the light-emitting element layer 200 may be disposed on the circuit element layer 100 in order to prevent moisture or oxygen from permeating into the light-emitting element layer 200 and to cover particles, thereby preventing movement of the particles. The encapsulation unit 300 may have a stack structure in which n inorganic encapsulation layers 310 and 330 (n being an integer equal to or greater than 2) and (n−1) organic encapsulation layers 320 are alternately disposed. The inorganic encapsulation layers 310 and 330 may prevent permeation of external moisture or oxygen. The organic encapsulation layer 320 may serve to cover particles and to alleviate stress between layers when the display panel is bent. The encapsulation unit 300 has a structure in which an organic encapsulation layer 320 having a large thickness sufficient to cover particles is disposed between inorganic encapsulation layers 310 and 330 having a small thickness. The organic encapsulation layer 320 may also be referred to as a particle cover layer (PCL).

Before the encapsulation unit 300 is formed, a dam unit 150 formed of the same insulating layer as at least one insulating layer of the display unit is further disposed in the bezel area BZ of the display unit. The dam unit 150 may prevent the liquid organic encapsulation layer 320 from spreading to the edge of the panel at the time of an inkjet process and to prevent the liquid organic encapsulation layer from spreading to the bending area BD and the pad area PDA of the bezel area BZ4. The dam unit 150 may be disposed in the bezel area BZ so as to be spaced apart from the active area AA in order to surround the active area AA, and may overlap the end of the encapsulation unit 300.

The dam unit 150 may include a plurality of dams 152 and 154 disposed in the bezel area BZ so as to be spaced apart from each other, and the plurality of dams 152 and 154 may have the same height or different heights. For example, the height of the second dam 154, which is disposed outside, may be greater than the height of the first dam 152, which is disposed inside. The plurality of dams 152 and 154 may be disposed on the insulating layers 112, 114, and 116 of the circuit element layer 100, and may overlap a power supply line of the circuit element layer 100 disposed in the bezel area BZ. The plurality of dams 152 and 154 may be formed of the same insulating layer as at least one of the planarization layer 118, the bank 250, or the spacer 260, and may be formed in a single layer structure or a multiple stack structure thereof. For example, each of the first dam 152 and the second dam 154 may include a structure in which a first insulating layer, which is the same layer as the planarization layer 118, and a second insulating layer, which is the same layer as the bank 250, are stacked, and the second dam 154 may have a structure in which a third insulating layer, which is the same layer as the spacer 260, is further stacked.

The encapsulation unit 300 has a stack structure in which the organic encapsulation layer 320 is disposed between the upper and lower inorganic encapsulation layers 310 and 330. The plurality of inorganic encapsulation layers 310 and 330 may be disposed in the active area AA, and may extend to the bezel area BZ to cover the dam unit 150. The organic encapsulation layer 320 may be disposed in the active area AA, and may extend to the bezel area BZ so as not to overlap the dam unit 150 or to partially overlap the first dam 152 disposed inside. The inorganic encapsulation layers 310 and 330 are formed in a structure configured to entirely wrap the upper surface, the lower surface, and the side surface of the organic encapsulation layer 320, and contact a portion of the dam unit 150 that does not overlap the organic encapsulation layer 320 at the outside thereof. The ends of the inorganic encapsulation layers 310 and 330 are located between the dam unit 150 and the bending area BD and thus do not overlap the bending area BD.

Each of the plurality of inorganic encapsulation layers 310 and 330 is formed of an inorganic insulating material that can be processed in a low-temperature process, and the organic encapsulation layer 320 is formed of an organic insulating material that can be processed in the low-temperature process. The inorganic insulating material may include one of silicon nitride, silicon oxide, silicon oxynitride, and aluminum oxide. The organic insulating material may include one of the above-described organic insulating materials.

The touch sensor unit 400 disposed on the encapsulation unit 300 includes a touch buffer layer 420, a bridge metal layer, a touch insulating layer 430, a sensor metal layer, and a touch passivation layer 440. The touch buffer layer 420 may be omitted. The touch buffer layer 420 configured to cover the encapsulation unit 300 is disposed on the display unit DP, on which the encapsulation unit 300 is formed, and the bridge metal layer is disposed on the touch buffer layer 420. The touch insulating layer 430 configured to cover the bridge metal layer is disposed on the touch buffer layer 420, the sensor metal layer is disposed on the touch insulating layer 430, and the touch passivation layer 440 configured to cover the sensor metal layer is disposed on the touch insulating layer 430.

The touch buffer layer 420, the touch insulating layer 430, and the touch passivation layer 440 may be disposed in the active area AA and the bezel area BZ, and are removed in the bending area BD to expose the crack prevention layer 140. The touch buffer layer 420, the touch insulating layer 430, and the touch passivation layer 440 are disposed along the side profile of the end of the encapsulation unit 300 in the bezel area BZ, and extend to cover the encapsulation unit 300. Each of the touch buffer layer 420 and the touch insulating layer 430 may be formed of an inorganic insulating material that can be processed in the low-temperature process. The touch passivation layer 440 configured to protect the sensor metal layer may provide a flat surface to the antireflection unit 500 thereon in the active area AA, and may be formed of one of an acrylic-based organic insulating material, a polyimide-based organic insulating material, and a siloxane-based organic insulating material, which are photocurable organic insulating materials that can be processed in the low-temperature process.

Each of the bridge metal layer and the sensor metal layer of the touch sensor unit 400 may be formed of an opaque metal material that exhibits high corrosion resistance, acid resistance, and conductivity, and may have a single layer structure or a multilayer structure. For example, each metal layer of the touch sensor unit 400 may be formed in a single layer structure or a multilayer structure including at least one of molybdenum (Mo), aluminum (Al), chromium (Cr), gold (Au), titanium (Ti), nickel (Ni), copper (Cu), neodymium (Nd), tungsten (W), or an alloy thereof. Each metal layer of the touch sensor unit 400 may be formed in a structure in which three metal layers are stacked, such as Ti/Al/Ti, Mo/Al/Mo, MoTi/Cu/MoTi, or Ti/Al/Mo.

The bridge metal layer located between the touch buffer layer 420 and the touch insulating layer 430 includes a plurality of bridge electrodes BE1 disposed in the active area AA. Also, in the case in which each touch routing line RL disposed in the bezel area BZ has a dual wiring structure, a lower routing line (second routing line) 410 of each touch routing line RL may be further included. However, this lower routing line 410 may be omitted.

The sensor metal layer located between the touch insulating layer 430 and the touch passivation layer 440 includes touch electrodes TE1 and TE2 and a bridge electrode BE2 disposed in the active area AA, and further includes an upper routing line (first routing line) 412 of each touch routing line RL disposed in the bezel area BZ and an upper touch pad 414 of the touch pad T-PD disposed in the pad area PDA of the bezel area BZ. The sensor metal layer may further include an upper display pad of the display pad D-PD disposed in the pad area PDA.

The first touch electrode TE1 is connected to the first bridge electrode BE1 via a contact hole 431 formed in the touch insulating layer 430. The upper routing line 412 connected to one of the first and second touch electrodes TE1 and TE2 is connected to the lower routing line 410 via a contact hole 432 formed in the touch insulating layer 430. Each touch routing line RL has a dual wiring structure in which the upper and lower routing lines 412 and 410 are connected to each other via a plurality of contact holes 432 while overlapping each other, whereby line resistance may be reduced and thus touch sensing performance may be improved.

The touch routing line RL is connected to the touch pad T-PD via a touch link line 132 extending through the lower part of the crack prevention layer 140 in the bending area BD. The touch link line 132 extends to a jumping unit JP from the lower touch pad 130 of the touch pad T-PD via the lower part of the crack prevention layer 140. The touch routing line RL is connected to the touch link line 132 via a contact hole 433 in the jumping unit JP. In the bezel area BZ, the upper routing line 412 extends longer than the lower routing line 410, whereby the upper routing line is connected to the touch link line 132 via the contact hole 433 while overlapping the touch link line 132 in the jumping unit JP. The contact hole 433 of the jumping unit JP is formed through the touch insulating layer 430 and the touch buffer layer 420 to expose a first side surface of the crack prevention layer 140. The upper routing line 412 is located on a first end of the crack prevention layer 140 including the first side surface exposed through the contact hole 433.

The touch pad T-PD includes a lower touch pad 130 connected to the touch link line 132 and an upper touch pad 414 connected to the lower touch pad 130 via a contact hole 434 while overlapping the lower touch pad. The contact hole 434 of the touch pad T-PD is formed through the touch insulating layer 430 and the touch buffer layer 420 to expose a second side surface of the crack prevention layer 140. The upper touch pad 414 is located on a second end of the crack prevention layer 140 including the second side surface exposed through the contact hole 434, and is also located on the end of the touch insulating layer 430.

The lower touch pad 130 and the touch link line 132 may be formed of the same metal layer as one metal layer belonging to the display unit DP, e.g. the same metal layer as the first and second electrodes 126 and 128 of the TFT 120 located on the interlayer insulating layer 116. The upper touch pad 414 may be formed of the same metal layer as one metal layer belonging to the touch sensor unit 400, e.g. the same metal layer as the sensor metal layer on the touch insulating layer 430. The contact hole 434 may be formed through at least one insulating layer belonging to the touch sensor unit 400, e.g. the touch buffer layer 420 and the touch insulating layer 430.

The display pad D-PD may also have the same upper and lower pad connection structure as in the touch pad T-PD and an end cover area 444 of the touch passivation layer 440. The display pad D-PD includes a lower display pad connected to a display link line and an upper display pad connected to the lower display pad via a contact hole formed through the touch insulating layer 430 and the touch buffer layer 420, wherein the end of the upper display pad may be located on the second end of the crack prevention layer 140 and may also be located on the end of the touch insulating layer 430 in the same manner as the upper touch pad 414.

The antireflection unit 500 is disposed on a flat surface provided by the touch passivation layer 440. The antireflection unit 500 includes R, G, and B color filters CF each overlapping the emissive area EA of each pixel and a black matrix BM overlapping a non-emissive area of each pixel and the electrodes TE and BE of the touch sensor unit 400. Each of the R, G, and B color filters CF has a wavelength selection property capable of selectively transmitting the wavelength of a corresponding color of light, and the black matrix BM absorbs external light, whereby the antireflection unit 500 may reduce reflection of external light due to the electrodes TE and BE of the touch sensor unit 400.

The antireflection unit 500 may further include an organic passivation layer 510 disposed on the touch passivation layer 440 so as to cover the color filter CF and the black matrix BM. The organic passivation layer 510 may include a low-temperature organic insulating material. The organic passivation layer 510 protects the color filter CF and the black matrix BM at the time of a dry etching process of the touch passivation layer 440 using the antireflection unit 500 as a mask. The touch passivation layer 440 may be removed from the bending area BD and the pad area PDA through a dry etching process using the organic passivation layer 510 of the antireflection unit 500 as a mask. In the bezel area BZ, the overlapping area of the organic passivation layer 510 is equal to the overlapping area of the touch passivation layer 440.

The antireflection unit 500 is disposed in the active area AA, and extends to the bezel area BZ so as to overlap the touch passivation layer 440 thereunder, but is not disposed in the bending area BD and the pad area PDA of the bezel area BZ. The touch passivation layer 440 is removed from the bending area BD and the pad area PDA through a dry etching process using the organic passivation layer 510 of the antireflection unit 500 as a mask. The antireflection unit 500 and the touch passivation layer 440 have the same side edges in the jumping unit JP adjacent to the bending area BD. The overlapping area between the antireflection unit 500 and the bezel area BZ is equal to the overlapping area between the touch passivation layer 440 and the bezel area BZ. The non-overlapping area between the antireflection unit 500 and the bezel area BZ is equal to the non-overlapping area between the touch passivation layer 440 and the bezel area BZ.

Referring to FIG. 9, the touch passivation layer 440 of the touch sensor unit 400 throughout the active area AA and the bezel area BZ, and the antireflection unit 500 is formed on the touch passivation layer 440 in the area other than the bending area BD and the pad area PDA through a patterning process. Subsequently, the touch passivation layer 440 exposed in the bending area BD and the pad area PDA is removed through a dry etching process using the organic passivation layer 510 of the antireflection unit 500 as a mask, as shown in FIG. 8, and the thickness of the organic passivation layer 510 is reduced.

During the process of forming the antireflection unit 500, therefore, the end of the touch routing line RL and the end of the upper touch pad 414 are protected by the touch passivation layer 440, whereby it is possible to prevent the end of the touch routing line RL and the end of the upper touch pad 414 from being exposed to the developing solution of the antireflection unit 500 and to prevent damage to the end of the touch routing line RL and the end of the upper touch pad 414, such as oxidation and corrosion, due to the developing solution of the antireflection unit 500. The touch passivation layer 440 may prevent the intermediate metal layer, i.e. the aluminum layer (Al), of the triple metal layer (Ti/Al/Ti) of the side surface of the end of the upper routing line 412 and the side surface of the end of the upper touch pad 414 from being exposed to the developing solution (KOH) of the antireflection unit 500, and may prevent defects due to the developing solution, such as oxidation and corrosion. Each of the upper touch pad 414 and the lower touch pad 130 may have a triple metal layer structure (Ti/Al/Ti).

An overcoat layer OC is further disposed on the antireflection unit 500, and provides a flat surface to another film attached to the overcoat layer OC. The optical film 600 shown in FIG. 2 may be attached to the flat surface of the overcoat layer OC, and the cover substrate 800 may be attached thereon via the OCA 700. The optical film 600 may include at least one of a semi-transmissive film, an ultraviolet absorption film, and a transmittance control film.

Figure 10:
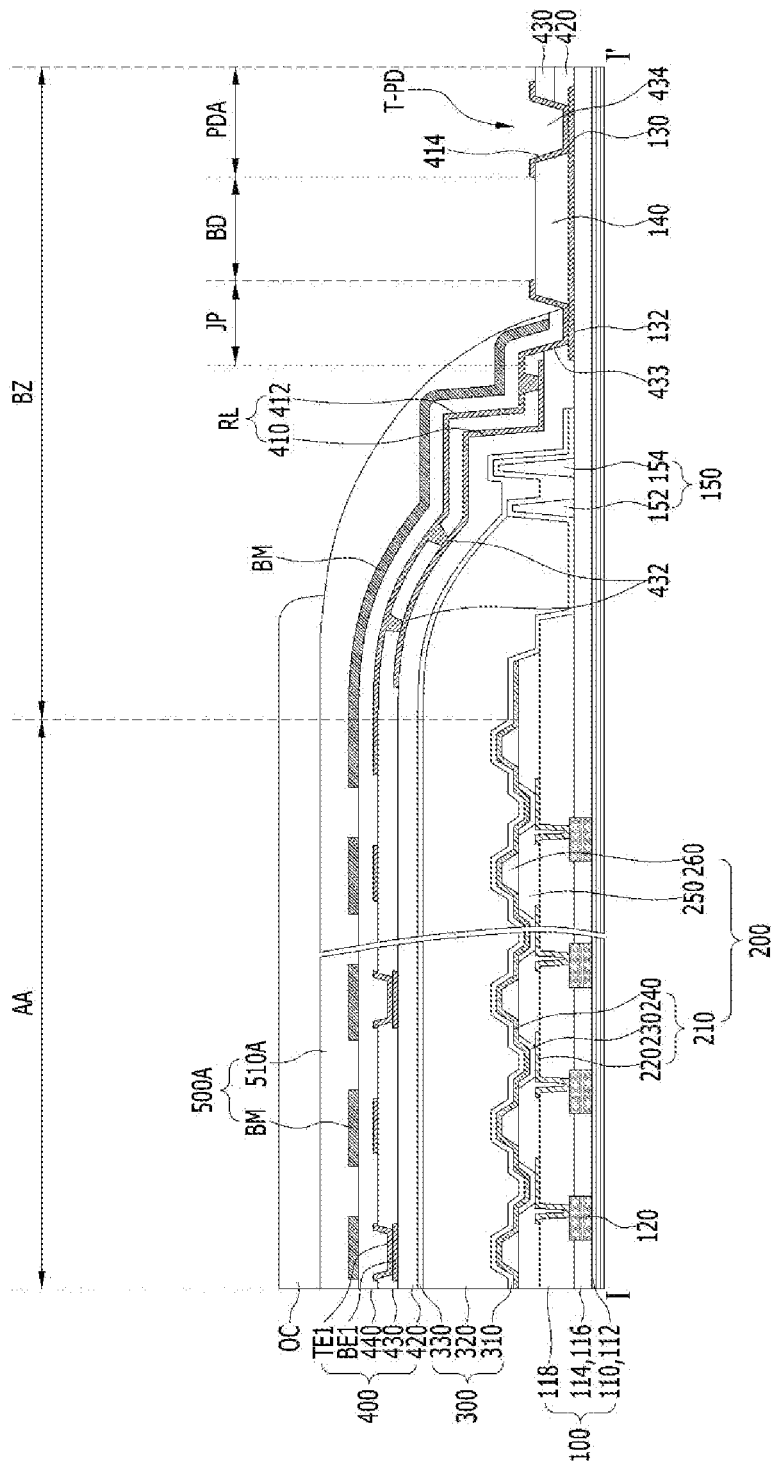
FIGS. 10 to 12 are cross-sectional views of touch display panels according to aspects of the present disclosure.
Figure 11:
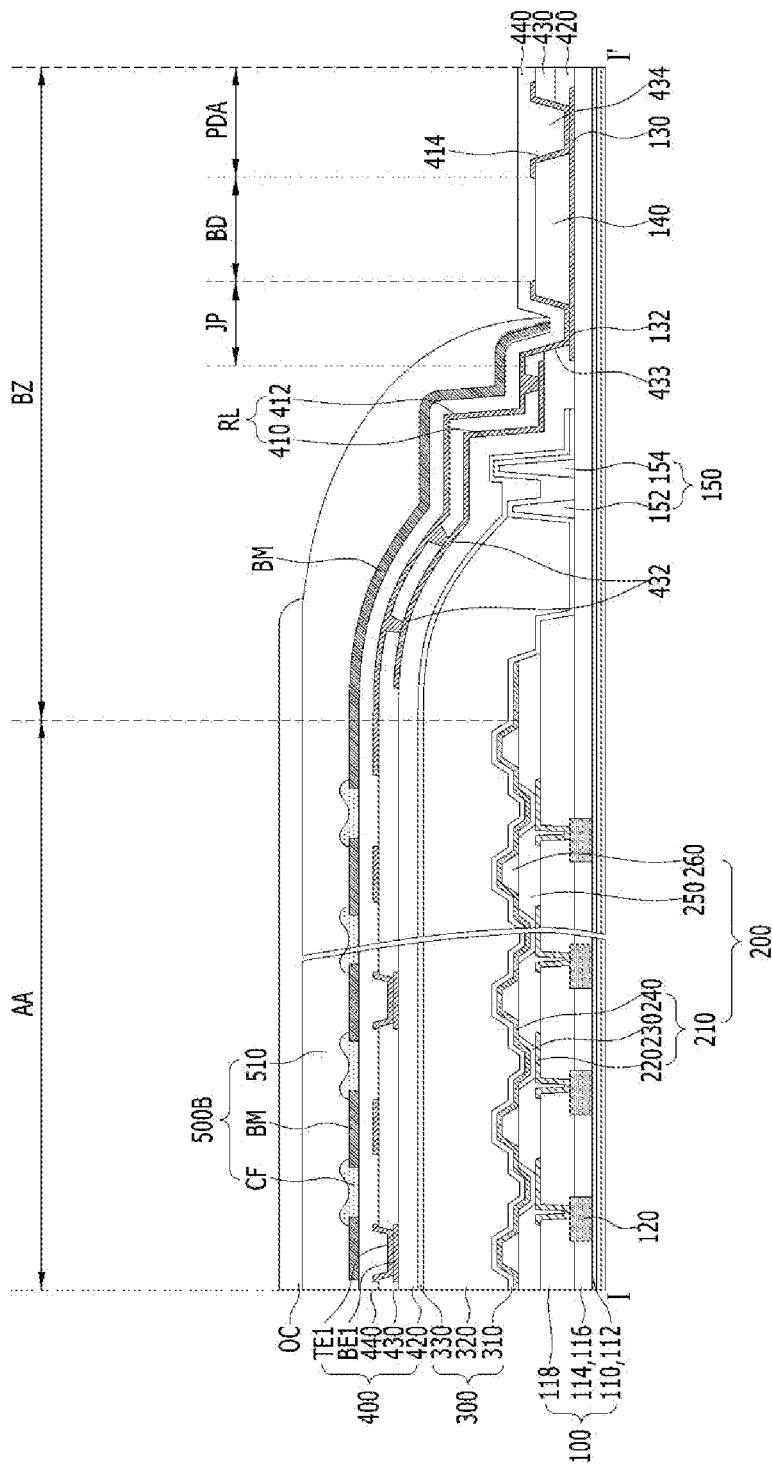
Figure 12:
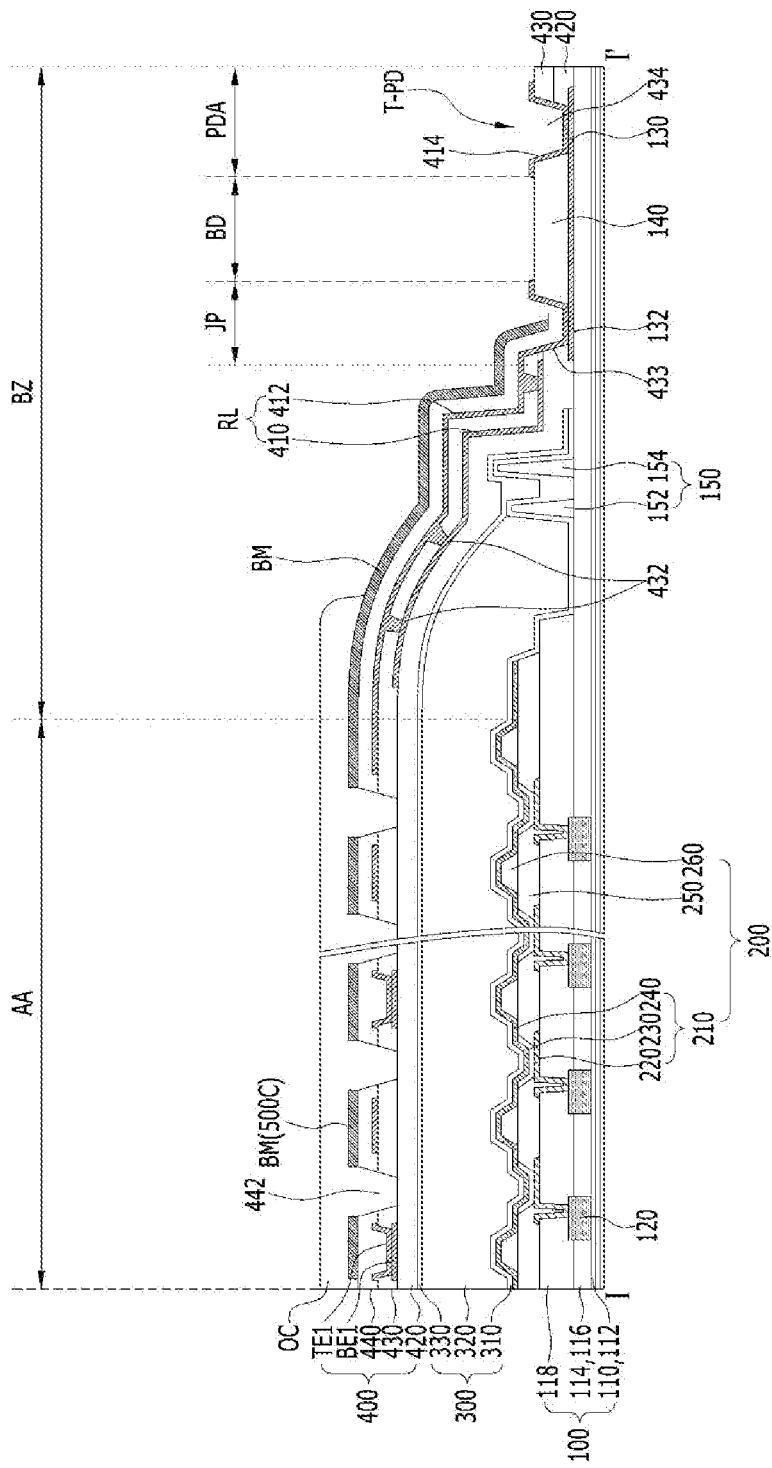

FIGS. 10 to 12 are cross-sectional views of touch display panels according to aspects of the present disclosure. The touch display panels according to these aspects are different in only the structure of the antireflection unit from the touch display panel of FIG. 8, and therefore a description will be given based on the difference from FIG. 8.

Referring to FIG. 10, an antireflection unit 500A according to an aspect includes a black matrix BM and an organic passivation layer 510A without a color filter CF, compared to FIG. 8, and an overcoat layer OC may be disposed on the organic passivation layer 510A. The touch passivation layer 440 may be removed from the bending area BD and the pad area PDA through a dry etching process using the organic passivation layer 510A of the antireflection unit 500A, which covers the black matrix BM, as a mask. During a patterning process of the antireflection unit 500A, therefore, the end of the touch routing line RL and the end of the upper touch pad 414, which have low resistance to a developing solution, are protected by the touch passivation layer 440, whereby it is possible to prevent damage to the ends of the routing line and the pad due to the developing solution. In the bezel area BZ, the overlapping area of the organic passivation layer 510A of the antireflection unit 500A is equal to the overlapping area of the touch passivation layer 440.

Referring to FIG. 11, an antireflection unit 500B according to an aspect of the present disclosure includes a color filter CF and a black matrix BM without an organic passivation layer 510, compared to FIG. 8. The touch passivation layer 440 may be removed from the bending area BD and the pad area PDA through a dry etching process using the color filter CF and the black matrix BM of the antireflection unit 500B as a mask, and the thickness of the color filter CF may be reduced by dry etching. During a patterning process of the antireflection unit 500B, therefore, the end of the touch routing line RL and the end of the upper touch pad 414, which have low resistance to a developing solution, are protected by the touch passivation layer 440, whereby it is possible to prevent damage to the ends of the routing line and the pad due to the developing solution. In the bezel area BZ, the overlapping area of the black matrix BM of the antireflection unit 500B is equal to the overlapping area of the touch passivation layer 440.

Referring to FIG. 12, an antireflection unit 500C according to an aspect of the present disclosure includes a black matrix BM without a color filter CF and an organic passivation layer 510, compared to FIG. 8. The touch passivation layer 440 may be removed from the bending area BD and the pad area PDA through a dry etching process using the black matrix BM of the antireflection unit 500C as a mask, and a recess 442, from which the touch passivation layer 440 exposed between the black matrix BM portions and the touch insulating layer 430 thereunder are removed, may be formed. During a patterning process of the antireflection unit 500C, therefore, the end of the touch routing line RL and the end of the upper touch pad 414, which have low resistance to a developing solution, are protected by the touch passivation layer 440, whereby it is possible to prevent damage to the ends of the routing line and the pad due to the developing solution. Meanwhile, an overcoat layer OC configured to fill the recess 442 while covering the black matrix BM may be further disposed on the antireflection unit 500C in order to provide a flat surface. In the bezel area BZ, the overlapping area of the black matrix BM of the antireflection unit 500C is equal to the overlapping area of the touch passivation layer 440.

Figure 13:
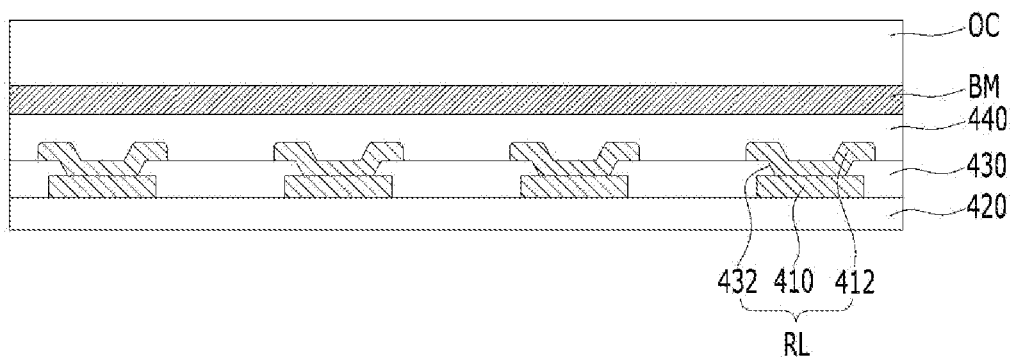
FIGS. 13 and 14 are cross-sectional views of a touch routing portion of the touch display panel shown in FIG. 3.
Figure 14:
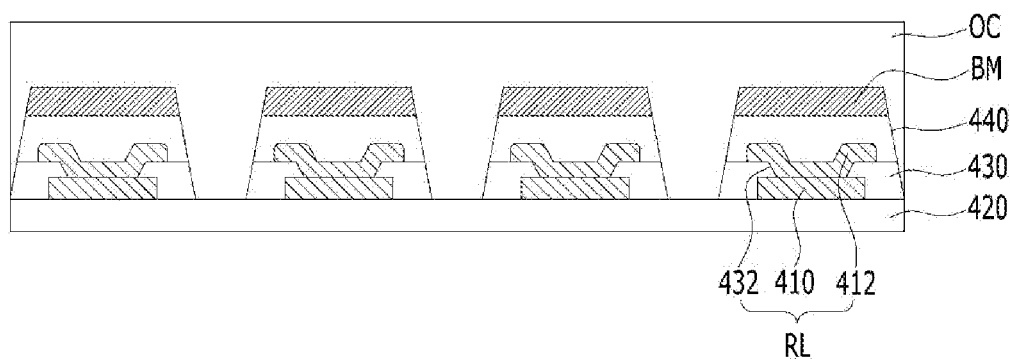

FIGS. 13 and 14 are cross-sectional views of the touch routing portion 60 of the touch display panel shown in FIG. 3.

Referring to FIGS. 13 and 14, the touch passivation layer 440 may be located on the plurality of touch routing lines RL located in the bezel area BZ1 shown in FIG. 3, the black matrix BM may be located on the touch passivation layer 440, and the black matrix BM may commonly overlap the plurality of touch routing lines RL, as shown in FIG. 13, or may individually overlap the plurality of touch routing lines RL, as shown in FIG. 14. In the case in which the touch passivation layer 440 is etched using the black matrix BM as a mask as in the aspect described with reference to FIG. 12, a recess may be formed in the touch passivation layer 440 and the touch insulating layer 430 between the black matrix BM portions, as shown in FIG. 14. The overcoat layer OC may be disposed on the black matrix BM so as to overlap the black matrix BM.

Although the touch display panel including the bending area BD has been described by way of example in the above aspects, the antireflection units 500, 500A, 500B, and 500C according to the aspects may be applied to a touch display panel including no bending area BD. In the case in which no bending area BD is included, each of the antireflection units 500, 500A, 500B, and 500C may be formed so as not to overlap the pad area PDA and to overlap the active area and the bezel area, and the touch passivation layer 440 may be removed from the pad area PDA using each of the antireflection units 500, 500A, 500B, and 500C as a mask.

As is apparent from the above description, in a touch display panel according to an aspect, an antireflection unit including a black matrix or including a color filter and a black matrix is directly disposed on a touch sensor unit, whereby it is possible to reduce reflectance of external light and to improve visibility. Consequently, no expensive polarizing plate is necessary, whereby it is possible to reduce manufacturing cost.

In the touch display panel according to the aspect, a bending area and a pad area are protected by a touch passivation layer so as not to be exposed while the antireflection unit is formed. When the antireflection unit is formed, therefore, it is possible to prevent the end of a touch routing line and the end of a pad in the bending area and the pad area from being exposed to a developing solution and thus to prevent damage thereto, whereby it is possible to improve product yield and product reliability.

In the touch display panel according to the aspect, the touch passivation layer in the bending area and the pad area is removed using the antireflection unit as a mask, whereby a mask process for removing the touch passivation layer in the bending area and the pad area is unnecessary and thus manufacturing cost is reduced.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

The various aspects described above can be combined to provide further aspects. These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. A touch display panel comprising:
   a display unit comprising an active area in which a plurality of pixels is disposed, and a bezel area adjacent to the active area;
   an encapsulation unit disposed on the display unit and sealing the plurality of pixels;
   a touch sensor unit disposed on the encapsulation unit;
   a touch passivation layer disposed on the active area and the bezel area to cover the touch sensor unit;
   an antireflection unit disposed on the touch passivation layer and having (1) a black matrix disposed in non-emissive areas of the active area and the bezel area and (2) an organic passivation layer disposed on the touch passivation layer and covering the black matrix, the black matrix is configured to absorb light; and
   a plurality of touch routing lines connected to touch sensor unit and disposed in the bezel area,
   wherein the antireflection unit and the touch passivation layer overlap with the active area and the bezel area and do not overlap with at least a pad area of the bezel area,
   wherein, in the bezel area, an overlapping area of the antireflection unit is equal to an overlapping area of the touch passivation layer and an overlapping area of the organic passivation layer is equal to the overlapping area of the touch passivation layer,
   wherein the black matrix overlaps the plurality of touch routing lines individually, and
   wherein the plurality of touch routing lines are disposed under the touch passivation layer and has an upper routing line and a lower routing line with an insulating film therebetween, and the upper routing line and the lower routing line are electrically connected to each other through a plurality of contact holes in the insulating film.

2. The touch display panel according to claim 1, wherein, in the bezel area, a non-overlapping area of the antireflection unit is equal to a non-overlapping area of the touch passivation layer.

3. The touch display panel according to claim 1, wherein the antireflection unit further comprises:
   a color filter overlapping an emissive area of each of the pixels,
   wherein the organic passivation layer disposed on the touch passivation layer covers the black matrix and the color filter, and
   wherein, in the bezel area, an overlapping area of the organic passivation layer is equal to an overlapping area of the touch passivation layer.

4. The touch display panel according to claim 1, wherein the antireflection unit further comprises a color filter overlapping an emissive area of each of the pixels, and
   wherein, in the bezel area, an overlapping area of the black matrix is equal to an overlapping area of the touch passivation layer.

5. The touch display panel according to claim 1, wherein, in the bezel area, an overlapping area of the black matrix of the antireflection unit is equal to an overlapping area of the touch passivation layer.

6. The touch display panel according to claim 5, wherein the touch passivation layer has a recess located between adjacent black matrices.

7. The touch display panel according to claim 1, further comprising an overcoat layer disposed on the antireflection unit and has a flat surface.

8. The touch display panel according to claim 3, further comprising:
   a crack prevention layer disposed in a bending area located in the bezel area;
   a touch link line connected to the plurality of touch routing lines in a jumping unit adjacent to the bending area and extended through a lower part of the crack prevention layer; and
   a touch pad connected to the touch link line and disposed in the pad area,
   wherein the antireflection unit and the touch passivation layer do not overlap with the bending area and the pad area of the bezel area.

9. The touch display panel according to claim 8, wherein the plurality of touch routing lines are connected to the touch link line through a first contact hole in the jumping unit, and
   wherein the first contact hole is formed through at least one insulating layer under the touch passivation layer and exposes a side surface of a first end of the crack prevention layer.

10. The touch display panel according to claim 9, wherein the plurality of touch routing lines are located on the first end of the crack prevention layer and overlapping with the first contact hole, and
    wherein side edges of the antireflection unit and the touch passivation layer coincide with each other in the jumping unit.

11. The touch display panel according to claim 10, wherein, when the black matrix individually overlaps with the plurality of touch routing lines, a recess is formed in the touch passivation layer between adjacent black matrices and an insulating layer thereunder.

12. The touch display panel according to claim 9, wherein the touch pad comprises:
    a lower touch pad connected to the touch link line; and
    an upper touch pad connected to the lower touch pad through a second contact hole in the pad area,
    wherein the second contact hole is formed through at least one insulating layer and exposes a second side surface of the crack prevention layer, and
    wherein the upper touch pad is located on a second end of the crack prevention layer and an end of the insulating layer and overlapping with the second contact hole.

13. The touch display panel according to claim 12, wherein each of the touch link line and the lower touch pad is formed of an identical metal on an identical layer to one electrode belonging to the display unit, and wherein each of the plurality of touch routing lines and the upper touch pad is formed of an identical metal on an identical layer to one electrode belonging to the touch sensor unit.

14. The touch display panel according to claim 12, wherein the display unit comprises:

a circuit element layer comprising a plurality of thin film transistors (TFTs); and a light-emitting element layer comprising a plurality of light-emitting elements disposed on the circuit element layer, wherein the encapsulation unit is disposed on the circuit element layer so as to seal the light-emitting element layer, and wherein the touch link line and the lower touch pad are formed of identical metals on identical layers to a source electrode and a drain electrode of each of the TFTs.

15. The touch display panel according to claim 12, wherein the touch sensor unit comprises:

a touch buffer layer on the encapsulation unit;

a bridge metal layer comprising a plurality of first bridge electrodes on the touch buffer layer;

a touch insulating layer disposed on the touch buffer layer so as to cover the bridge metal layer;

a sensor metal layer comprising a plurality of first touch electrodes and a plurality of second touch electrodes disposed on the touch insulating layer, wherein the plurality of first touch electrodes and the plurality of second touch electrodes constitute a plurality of touch sensors and are spaced apart from each other, and wherein adjacent second touch electrodes are interconnected via second bridge electrodes, and adjacent first touch electrodes are connected to each other via a contact hole formed in the touch insulating layer and each of the first bridge electrodes;

a touch passivation layer disposed on the touch insulating layer and covering the sensor metal layer; and wherein each of the plurality of touch routing lines and the upper touch pad is formed of an identical metal layer to the sensor metal layer.

16. The touch display panel according to claim 15, wherein the plurality of touch routing lines comprise an upper routing line and a lower routing line overlapping with each other in a state in which the touch insulating layer is interposed therebetween, and wherein the upper routing line and the lower routing line are connected to each other via a contact hole formed in the touch insulating layer.

17. The touch display panel according to claim 15, wherein the first touch electrodes, the second touch electrodes, and the second bridge electrodes have a mesh pattern shape overlapping with the non-emissive area, and wherein the first bridge electrodes have a mesh pattern shape or a line pattern shape overlapping with the non-emissive area.

18. The touch display panel according to claim 1, wherein the touch passivation layer is formed of one of an acrylic-based organic insulating material, a polyimide-based organic insulating material, and a siloxane-based organic insulating material.

* * * * *